(12) United States Patent
Chann

(10) Patent No.: US 10,871,639 B2
(45) Date of Patent: *Dec. 22, 2020

(54) OPTICAL CROSS-COUPLING MITIGATION SYSTEMS FOR WAVELENGTH BEAM COMBINING LASER SYSTEMS

(71) Applicant: Bien Chann, Merrimack, NH (US)

(72) Inventor: Bien Chann, Merrimack, NH (US)

(73) Assignee: TERADIODE, INC., Wilmington, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/559,834

(22) Filed: Sep. 4, 2019

(65) Prior Publication Data
US 2020/0057286 A1 Feb. 20, 2020

Related U.S. Application Data

(63) Continuation of application No. 15/992,593, filed on May 30, 2018, now Pat. No. 10,444,482, which is a
(Continued)

(51) Int. Cl.
*G02B 27/10* (2006.01)
*H01S 3/00* (2006.01)
(Continued)

(52) U.S. Cl.
CPC ....... *G02B 19/0057* (2013.01); *G02B 6/0208* (2013.01); *G02B 6/14* (2013.01);
(Continued)

(58) Field of Classification Search
CPC .......... G02B 27/08; G02B 26/00; G02B 3/00; G02B 27/10; G02B 27/14; G02B 27/12; G02B 5/04; G02F 1/29; G02F 1/03; G02F 1/01; G02F 1/33; G02F 1/11
USPC ....... 359/618, 299, 624, 245, 241, 244, 288, 359/305, 285, 308, 311–312, 290–292, 359/872, 263, 223–224, 318, 649, 846, 359/129, 496, 631, 629, 634, 636,
(Continued)

(56) References Cited

U.S. PATENT DOCUMENTS

| 4,917,084 A | 4/1990 | Sinofsky |
| 5,917,625 A | 6/1999 | Ogusu et al. |

(Continued)

FOREIGN PATENT DOCUMENTS

| JP | 2007-165624 A | 6/2007 |
| WO | 2002/091077 A1 | 11/2002 |

(Continued)

OTHER PUBLICATIONS

Intenational Search Report and Written Opinion issued in a corresponding International Application No. PCT/US2015/064891 dated Apr. 11, 2016.
(Continued)

*Primary Examiner* — Dawayne Pinkney
(74) *Attorney, Agent, or Firm* — Morgan, Lewis & Bockius LLP

(57) ABSTRACT

In various embodiments, wavelength beam combining laser systems incorporate optical cross-coupling mitigation systems and/or engineered partially reflective output couplers in order to reduce or substantially eliminate unwanted back-reflection of stray light.

24 Claims, 6 Drawing Sheets

Related U.S. Application Data continuation of application No. 15/692,046, filed on Aug. 31, 2017, now Pat. No. 10,168,517, which is a continuation of application No. 14/964,700, filed on Dec. 10, 2015, now Pat. No. 9,778,448, which is a continuation-in-part of application No. 14/746,951, filed on Jun. 23, 2015, now Pat. No. 9,268,142, which is a continuation of application No. 13/841,821, filed on Mar. 15, 2013, now Pat. No. 9,256,073, which is a continuation-in-part of application No. 13/218,251, filed on Aug. 25, 2011, now Pat. No. 8,488,245, which is a continuation-in-part of application No. 13/042,042, filed on Mar. 7, 2011, now Pat. No. 8,553,327.

(60) Provisional application No. 61/310,777, filed on Mar. 5, 2010, provisional application No. 61/310,781, filed on Mar. 5, 2010, provisional application No. 61/417,394, filed on Nov. 26, 2010, provisional application No. 61/376,900, filed on Aug. 25, 2010, provisional application No. 62/089,839, filed on Dec. 10, 2014.

(51) Int. Cl.
| | | |
|---|---|---|
| *H01S 3/08* | (2006.01) | |
| *G03B 21/26* | (2006.01) | |
| *G02B 6/28* | (2006.01) | |
| *G02B 19/00* | (2006.01) | |
| *G02B 6/14* | (2006.01) | |
| *G02B 27/09* | (2006.01) | |
| *G02B 6/26* | (2006.01) | |
| *G02B 6/32* | (2006.01) | |
| *G02B 6/293* | (2006.01) | |
| *G02B 27/42* | (2006.01) | |
| *G02B 6/02* | (2006.01) | |
| *H01S 5/40* | (2006.01) | |
| *G02B 5/18* | (2006.01) | |
| *H01S 5/14* | (2006.01) | |

(52) U.S. Cl.
CPC ......... *G02B 6/262* (2013.01); *G02B 6/29317* (2013.01); *G02B 6/32* (2013.01); *G02B 19/0014* (2013.01); *G02B 19/0028* (2013.01); *G02B 27/0905* (2013.01); *G02B 27/1006* (2013.01); *G02B 27/4244* (2013.01); *H01S 5/4062* (2013.01); *G02B 2005/1804* (2013.01); *H01S 3/08063* (2013.01); *H01S 5/141* (2013.01); *H01S 5/4068* (2013.01); *H01S 5/4087* (2013.01)

(58) Field of Classification Search
USPC ............ 359/638–640, 833–831, 630, 341.3, 359/341.33, 337.21; 353/31, 34, 81; 451/28, 41; 372/25, 92, 98, 102
See application file for complete search history.

(56) References Cited

U.S. PATENT DOCUMENTS

| | | |
|---|---|---|
| 6,044,096 A | 3/2000 | Wolak et al. |
| 6,192,062 B1 | 2/2001 | Sanchez-Rubio et al. |
| 6,356,576 B1 | 3/2002 | Smith |
| 6,625,195 B1 | 9/2003 | Henrichs |
| 8,049,966 B2 | 11/2011 | Chann et al. |
| 9,268,142 B2 | 2/2016 | Chann et al. |
| 9,256,073 B2 | 9/2016 | Chann et al. |
| 9,778,448 B2 | 10/2017 | Chann |
| 10,168,517 B2 | 1/2019 | Chann |
| 2002/0071627 A1 | 6/2002 | Smith et al. |
| 2003/0165176 A1 | 9/2003 | Minden |
| 2003/0193974 A1 | 10/2003 | Frankel et al. |
| 2004/0095983 A1 | 5/2004 | Whitley |
| 2006/0109876 A1 | 5/2006 | Donoghue et al. |
| 2007/0002925 A1 | 1/2007 | Zediker et al. |
| 2007/0258673 A1 | 11/2007 | El-Sherif |
| 2009/0180511 A1 | 7/2009 | Muendel |
| 2010/0110556 A1 | 5/2010 | Chann |
| 2012/0082175 A1 | 4/2012 | Putnam et al. |
| 2012/0262938 A1 | 10/2012 | Price et al. |
| 2013/0208361 A1 | 8/2013 | Chann et al. |
| 2018/0373008 A1 | 12/2018 | Chann |

FOREIGN PATENT DOCUMENTS

| | | |
|---|---|---|
| WO | 2006045303 A2 | 5/2006 |
| WO | 2006/097531 A1 | 9/2006 |

OTHER PUBLICATIONS

Chann et al., "Efficient, High-Brightness Wavelength-Beam-Combined Commercial of the Shelf Diode Stacks Achieved by use of a Wavelength-Chirped Volume Bragg Grating", Optics Letters, vol. 31, No. 9, May 1, 2006, pp. 1253-1255.

Chann et al., "High-Power Near-Diffraction-Limited Wavelenghth-Bean Combined Diode Arrays", Conference on Lasers & Electro Optics (CLEO), vol. 1, May 27, 2005, pp. 429-431.

Chann et al., "Near-Diffraction-Limited Diode Laser Arrays by Wavelength Beam Combining", Optics Letters, vol. 30, No. 16, Aug. 15, 2005, pp. 2104-2106.

OPTICAL CROSS-COUPLING MITIGATION SYSTEMS FOR WAVELENGTH BEAM COMBINING LASER SYSTEMS

RELATED APPLICATIONS

This application is a continuation of U.S. patent application Ser. No. 15/992,593, filed May 30, 2018, which is a continuation of U.S. patent application Ser. No. 15/692,046, filed Aug. 31, 2017, which is a continuation of U.S. patent application Ser. No. 14/964,700, filed Dec. 10, 2015, which (A) claims the benefit of and priority to U.S. Provisional Patent Application No. 62/089,839, filed on Dec. 10, 2014, and (B) is a continuation-in-part of U.S. patent application Ser. No. 14/746,951, filed on Jun. 23, 2015, which is a continuation of U.S. patent application Ser. No. 13/841,821, filed on Mar. 15, 2013, which is a continuation-in-part of U.S. patent application Ser. No. 13/218,251, filed on Aug. 25, 2011, which (i) claims the benefit of and priority to U.S. Provisional Patent Application No. 61/376,900, filed on Aug. 25, 2010, and (ii) is a continuation-in-part of U.S. patent application Ser. No. 13/042,042, filed on Mar. 7, 2011, which claims the benefit of and priority to U.S. Provisional Patent Application No. 61/310,777, filed on Mar. 5, 2010, U.S. Provisional Patent Application No. 61/310,781, filed on Mar. 5, 2010, and U.S. Provisional Patent Application No. 61/417,394, filed on Nov. 26, 2010. The entire disclosure of each of these applications is hereby incorporated herein by reference.

TECHNICAL FIELD

In various embodiments, the present invention relates to laser systems, specifically wavelength beam combining laser systems incorporating systems for mitigating optical cross-coupling between beam emitters.

BACKGROUND

High-power laser systems are utilized for a host of different applications, such as welding, cutting, drilling, and materials processing. Such laser systems typically include a laser emitter, the laser light from which is coupled into an optical fiber (or simply a "fiber"), and an optical system that focuses the laser light from the fiber onto the workpiece to be processed. The optical system is typically engineered to produce the highest-quality laser beam, or, equivalently, the beam with the lowest beam parameter product (BPP). The BPP is the product of the laser beam's divergence angle (half-angle) and the radius of the beam at its narrowest point (i.e., the beam waist, the minimum spot size). The BPP quantifies the quality of the laser beam and how well it can be focused to a small spot, and is typically expressed in units of millimeter-milliradians (mm-mrad). A Gaussian beam has the lowest possible BPP, given by the wavelength of the laser light divided by pi. The ratio of the BPP of an actual beam to that of an ideal Gaussian beam at the same wavelength is denoted $M^2$, or the "beam quality factor," which is a wavelength-independent measure of beam quality, with the "best" quality corresponding to the "lowest" beam quality factor of 1.

Wavelength beam combining (WBC) is a technique for scaling the output power and brightness from laser diode bars, stacks of diode bars, or other lasers arranged in a one- or two-dimensional array. WBC methods have been developed to combine beams along one or both dimensions of an array of emitters. Typical WBC systems include a plurality of emitters, such as one or more diode bars, that are combined using a dispersive element to form a multi-wavelength beam. Each emitter in the WBC system individually resonates, and is stabilized through wavelength-specific feedback from a common partially reflecting output coupler that is filtered by the dispersive element along a beam-combining dimension. Exemplary WBC systems are detailed in U.S. Pat. No. 6,192,062, filed on Feb. 4, 2000, U.S. Pat. No. 6,208,679, filed on Sep. 8, 1998, U.S. Pat. No. 8,670,180, filed on Aug. 25, 2011, and U.S. Pat. No. 8,559,107, filed on Mar. 7, 2011, the entire disclosure of each of which is incorporated by reference herein.

A variety of WBC techniques have been utilized to form high-power lasers for many different applications. However, optical cross-coupling between beam emitters may result in conventional WBC systems having sub-optimal brightness. Thus, there is a need for cross-coupling mitigation arrangements for WBC laser systems.

SUMMARY

In accordance with embodiments of the present invention, wavelength beam combining (WBC) laser systems feature multiple emitters (or "beam emitters"), e.g., diode bars or the individual diode emitters of a diode bar, which are combined to form a multi-wavelength beam. Each emitter in the laser system individually resonates and is stabilized via wavelength-specific feedback from a common partially reflecting output coupler that is filtered by a dispersive element (e.g., a diffraction grating, a dispersive prism, a grism (prism/grating), a transmission grating, or an Echelle grating) along a beam-combining dimension. Advantageously, cross-talk between feedback beams is mitigated using a non-slit-based cross-coupling mitigating optical system. In various embodiments, the cross-coupling mitigation system, or at least a portion thereof, is positioned within the Rayleigh range of the multi-wavelength beam transmitted by the dispersive element, and the output coupler is positioned within the Rayleigh range of the multi-wavelength beam transmitted by the cross-coupling mitigation system (or at least a portion thereof). In this manner, laser systems in accordance with embodiments of the present invention produce multi-wavelength output beams having high brightness and high power.

In various embodiments, the cross-coupling mitigation system includes or consists essentially of first and second optical elements (e.g., lenses), and the focal length of the first optical element is greater (or even substantially greater) than the focal length of the second optical element. In such embodiments, the first optical element may be positioned within the Rayleigh range of the multi-wavelength beam transmitted by the dispersive element, and the output coupler may be positioned within the Rayleigh range of the multi-wavelength beam transmitted by the second optical element.

In various embodiments, optical cross-coupling is also reduced or substantially eliminated via the use of engineered output couplers that minimize back-reflection of stray wavelengths that might reflect back to the individual beam emitters. Such output couplers may be utilized with or without other cross-coupling mitigation systems described herein. In various embodiments, the partially reflective output coupler incorporates an anti-reflection coating on its surface in regions other than a partially reflective portion sized and positioned to intercept only the multi-wavelength beam. The partially reflective portion may protrude from the remaining portion of the output coupler, or the partially reflective portion may be substantially coplanar with the remaining portion.

In various embodiments of the invention, the output coupler may include or consist essentially of an optical fiber, the core of which is sized and positioned to intercept only the multi-wavelength beam. The surface of the core may be partially reflective, and/or the core may include therewithin a fiber Bragg grating to provide the feedback-enabling reflection of the beam. The cladding of the optical fiber may be coated with an anti-reflection coating to prevent stray reflection and optical cross-coupling resulting therefrom. An end cap may be present over the optical fiber for, e.g., environmental protection and/or to reduce the power density at the end of the fiber. In various embodiments, the optical fiber may incorporate and/or be utilized in conjunction with a mode stripper that substantially eliminates unwanted modes of light from propagating within the optical fiber.

Embodiments of the present invention couple multi-wavelength output beams into an optical fiber. In various embodiments, the optical fiber has multiple cladding layers surrounding a single core, multiple discrete core regions (or "cores") within a single cladding layer, or multiple cores surrounded by multiple cladding layers. In various embodiments, the output beams may be delivered to a workpiece for applications such as cutting, welding, etc.

Herein, "optical elements" may refer to any of lenses, mirrors, prisms, gratings, and the like, which redirect, reflect, bend, or in any other manner optically manipulate electromagnetic radiation. Herein, beam emitters, emitters, or laser emitters, or lasers include any electromagnetic beam-generating device such as semiconductor elements, which generate an electromagnetic beam, but may or may not be self-resonating. These also include fiber lasers, disk lasers, non-solid state lasers, vertical cavity surface emitting lasers (VCSELs), etc. Generally, each emitter includes a back reflective surface, at least one optical gain medium, and a front reflective surface. The optical gain medium increases the gain of electromagnetic radiation that is not limited to any particular portion of the electromagnetic spectrum, but that may be visible, infrared, and/or ultraviolet light. An emitter may include or consist essentially of multiple beam emitters such as a diode bar configured to emit multiple beams. The input beams received in the embodiments herein may be single-wavelength or multi-wavelength beams combined using various techniques known in the art.

Laser diode arrays, bars and/or stacks, such as those described in the following general description may be used in association with embodiments of the innovations described herein. Laser diodes may be packaged individually or in groups, generally in one-dimensional rows/arrays (diode bars) or two dimensional arrays (diode-bar stacks). A diode array stack is generally a vertical stack of diode bars. Laser diode bars or arrays generally achieve substantially higher power, and cost effectiveness than an equivalent single broad area diode. High-power diode bars generally contain an array of broad-area emitters, generating tens of watts with relatively poor beam quality; despite the higher power, the brightness is often lower than that of a broad area laser diode. High-power diode bars may be stacked to produce high-power stacked diode bars for generation of extremely high powers of hundreds or thousands of watts. Laser diode arrays may be configured to emit a beam into free space or into a fiber. Fiber-coupled diode-laser arrays may be conveniently used as a pumping source for fiber lasers and fiber amplifiers.

A diode-laser bar is a type of semiconductor laser containing a one-dimensional array of broad-area emitters or alternatively containing sub arrays containing, e.g., 10-20 narrow stripe emitters. A broad-area diode bar typically contains, for example, 19-49 emitters, each having dimensions on the order of, e.g., 1 µm×100 µm. The beam quality along the 1 µm dimension or fast-axis is typically diffraction-limited. The beam quality along the 100 µm dimension or slow-axis or array dimension is typically many times diffraction-limited. Typically, a diode bar for commercial applications has a laser resonator length of the order of 1 to 4 mm, is about 10 mm wide and generates tens of watts of output power. Most diode bars operate in the wavelength region from 780 to 1070 nm, with the wavelengths of 808 nm (for pumping neodymium lasers) and 940 nm (for pumping Yb:YAG) being most prominent. The wavelength range of 915-976 nm is used for pumping erbium-doped or ytterbium-doped high-power fiber lasers and amplifiers.

A diode stack is simply an arrangement of multiple diode bars that can deliver very high output power. Also called diode laser stack, multi-bar module, or two-dimensional laser array, the most common diode stack arrangement is that of a vertical stack which is effectively a two-dimensional array of edge emitters. Such a stack may be fabricated by attaching diode bars to thin heat sinks and stacking these assemblies so as to obtain a periodic array of diode bars and heat sinks. There are also horizontal diode stacks, and two-dimensional stacks. For the high beam quality, the diode bars generally should be as close to each other as possible. On the other hand, efficient cooling requires some minimum thickness of the heat sinks mounted between the bars. This tradeoff of diode bar spacing results in beam quality of a diode stack in the vertical direction (and subsequently its brightness) is much lower than that of a single diode bar. There are, however, several techniques for significantly mitigating this problem, e.g., by spatial interleaving of the outputs of different diode stacks, by polarization coupling, or by wavelength multiplexing. Various types of high-power beam shapers and related devices have been developed for such purposes. Diode stacks may provide extremely high output powers (e.g. hundreds or thousands of watts).

In an aspect, embodiments of the invention feature a laser system that includes or consists essentially of an array (e.g., a one-dimensional array or a two-dimensional array) of beam emitters each emitting a beam, focusing optics for focusing the beams toward a dispersive element, a dispersive element for receiving and dispersing the focused beams, thereby forming a multi-wavelength beam, and an optical fiber for receiving the multi-wavelength beam. The optical fiber includes or consists essentially of (i) a core for receiving the multi-wavelength beam, reflecting a first portion thereof back toward the dispersive element, and transmitting a second portion thereof as an output beam composed of multiple wavelengths, the core having a partially reflective surface, and (ii) surrounding the core, a cladding having a reflectivity to the multi-wavelength beam of less than 1%.

Embodiments of the invention may include one or more of the following in any of a variety of combinations. A portion of the core may protrude from the cladding. A surface of the core may be substantially coplanar with a surface of the cladding. The optical fiber may be positioned such that, at the partially reflective surface of the core, a diameter (or other lateral dimension, e.g., width) of the core is not less than a diameter (or other lateral dimension, e.g., width) of the multi-wavelength beam. The diameter of the core may be substantially equal to or greater than the diameter of the multi-wavelength beam. An end cap may be attached to the optical fiber and disposed optically upstream of the partially reflective surface of the core. An anti-reflective coating may be disposed over the cladding of the optical fiber. A mode stripper may be disposed around at least a portion of the core of the optical fiber. The mode stripper may be disposed around at least a portion of the cladding of the optical fiber. The focusing optics may include or consist essentially of one or more cylindrical lenses, one or more spherical lenses, one or more spherical mirrors, and/or one or more cylindrical mirrors. The dispersive element may include or consist essentially of a diffraction grating (e.g., a transmissive diffraction grating or a reflective diffraction grating).

The laser system may include a cross-coupling mitigation system for receiving and transmitting the multi-wavelength beam while reducing cross-coupling thereof. The partially reflecting surface of the core of the optical fiber may be disposed within a Rayleigh range of the multi-wavelength beam transmitted by the cross-coupling mitigation system. At least a portion of the cross-coupling mitigation system may be disposed within a Rayleigh range of the multi-wavelength beam transmitted by the dispersive element. The cross-coupling mitigation system may be afocal. The cross-coupling mitigation system may include or consist essentially of an afocal telescope. The cross-coupling mitigation system may include or consist essentially of a first optical element having a first focal length and a second optical element having a second focal length. The first optical element may be disposed optically upstream of the second optical element. The first focal length may be at least two, at least three, at least five, at least seven, at least ten, or at least 100 times greater than the second focal length. Each of the first and second optical elements may include or consist essentially of a lens (e.g., a cylindrical lens or a spherical lens). The first optical element may be disposed within a Rayleigh range of the multi-wavelength beam transmitted by the dispersive element. The partially reflecting surface of the core of the optical fiber may be disposed within a Rayleigh range of the multi-wavelength beam transmitted by the second optical element. The optical distance between the first and second optical elements may be approximately equal to a sum of the first and second focal lengths.

In another aspect, embodiments of the invention feature a laser system that includes or consists essentially of an array of beam emitters each emitting a beam, focusing optics for focusing the beams toward a dispersive element, a dispersive element for receiving and dispersing the focused beams, thereby forming a multi-wavelength beam, a cross-coupling mitigation system for receiving and transmitting the multi-wavelength beam while reducing cross-coupling thereof, disposed optically downstream of the cross-coupling mitigation system, an optical fiber for receiving the multi-wavelength beam, and disposed within the optical fiber, a fiber Bragg grating for receiving the multi-wavelength beam, reflecting a first portion thereof back toward the cross-coupling mitigation system, and transmitting a second portion thereof as an output beam composed of multiple wavelengths.

Embodiments of the invention may include one or more of the following in any of a variety of combinations. An end cap may be attached to the optical fiber and disposed optically upstream of the fiber Bragg grating. The focusing optics may include or consist essentially of one or more cylindrical lenses, one or more spherical lenses, one or more spherical mirrors, and/or one or more cylindrical mirrors. The dispersive element may include or consist essentially of a diffraction grating (e.g., a transmissive diffraction grating or a reflective diffraction grating). A mode stripper may be disposed around at least a portion of the optical fiber. The fiber Bragg grating may be disposed within a Rayleigh range of the multi-wavelength beam transmitted by the cross-coupling mitigation system. At least a portion of the cross-coupling mitigation system may be disposed within a Rayleigh range of the multi-wavelength beam transmitted by the dispersive element. The cross-coupling mitigation system may be afocal. The cross-coupling mitigation system may include or consist essentially of an afocal telescope. The cross-coupling mitigation system may include or consist essentially of a first optical element having a first focal length and a second optical element having a second focal length. The first optical element may be disposed optically upstream of the second optical element. The first focal length may be at least two, at least three, at least five, at least seven, at least ten, or at least 100 times greater than the second focal length. Each of the first and second optical elements may include or consist essentially of a lens (e.g., a cylindrical lens or a spherical lens). The first optical element may be disposed within a Rayleigh range of the multi-wavelength beam transmitted by the dispersive element. The fiber Bragg grating may be disposed within a Rayleigh range of the multi-wavelength beam transmitted by the second optical element. The optical distance between the first and second optical elements may be approximately equal to a sum of the first and second focal lengths.

These and other objects, along with advantages and features of the present invention herein disclosed, will become more apparent through reference to the following description, the accompanying drawings, and the claims. Furthermore, it is to be understood that the features of the various embodiments described herein are not mutually exclusive and may exist in various combinations and permutations. As used herein, the terms "substantially" and "approximately" mean ±10%, and in some embodiments, ±5%. The term "consists essentially of" means excluding other materials that contribute to function, unless otherwise defined herein. Nonetheless, such other materials may be present, collectively or individually, in trace amounts. Herein, the terms "radiation" and "light" are utilized interchangeably unless otherwise indicated. Herein, "downstream" or "optically downstream," is utilized to indicate the relative placement of a second element that a light beam strikes after encountering a first element, the first element being "upstream," or "optically upstream" of the second element. Herein, "optical distance" between two components is the distance between two components that is actually traveled by light beams; the optical distance may be, but is not necessarily, equal to the physical distance between two components due to, e.g., reflections from mirrors or other changes in propagation direction experienced by the light traveling from one of the components to the other.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following drawings, in which.

DETAILED DESCRIPTION

Figure 1A:
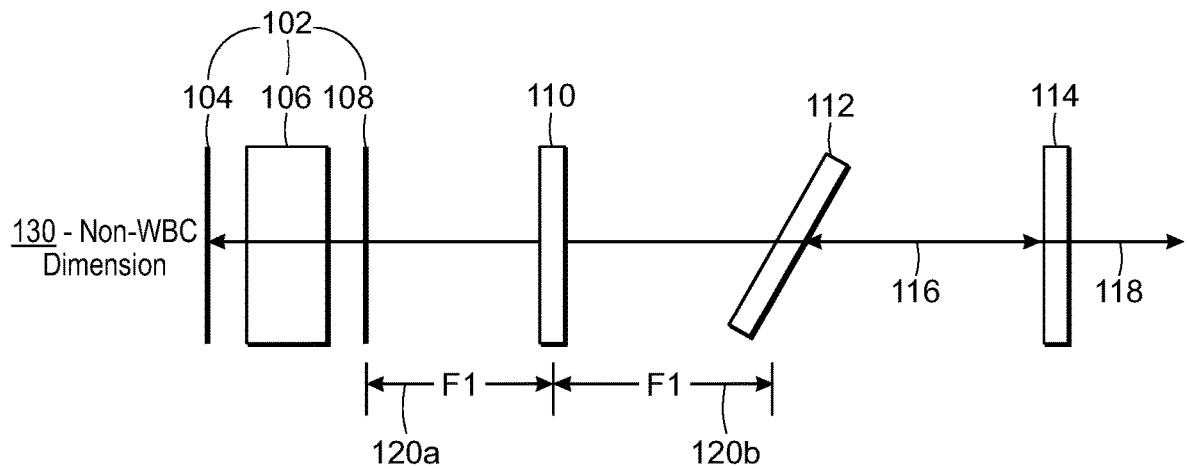
FIG. 1A is a schematic of a wavelength beam combining (WBC) method in the non-beam-combining dimension in accordance with embodiments of the invention.

Aspects and embodiments relate generally to the field of scaling laser sources to high-power and high-brightness using an external cavity and, more particularly, to methods and apparatus for external-cavity beam combining using both one-dimensional or two-dimensional laser sources. In one embodiment the external cavity system includes one-dimensional or two-dimensional laser elements, an optical system, a dispersive element, and a partially reflecting element. An optical system is one or more optical elements that perform two basic functions. The first function is to overlap all the laser elements along the beam combining dimension onto a dispersive element. The second function is to ensure all the elements along the non-beam combining dimension are propagating normal to the output coupler. In various embodiments, the optical system introduces as little loss as possible. As such, these two functions will enable a single resonance cavity for all the laser elements.

In another embodiment the WBC external cavity system includes wavelength stabilized one-dimensional or two-dimensional laser elements, an optical system, and a dispersive element. One-dimensional or two-dimensional wavelength stabilized laser elements, with unique wavelength, can be accomplished using various means such as laser elements with feedback from wavelength chirped Volume Bragg grating, distributed feedback (DFB) laser elements, or distributed Bragg reflector (DBR) laser elements. Here the main function of the optical system is to overlap all the beams onto a dispersive element. When there is no output coupler mirror external to the wavelength-stabilized laser element, having parallel beams along the non-beam-combining dimension is less important. Aspects and embodiments further relate to high-power and/or high-brightness multi-wavelength external-cavity lasers that generate an overlapping or coaxial beam from very low output power to hundreds and even to megawatts of output power.

Embodiments of the present invention mitigate the amount of unintended and/or undesired feedback from non-originated emitters in WBC laser systems. For example, in a WBC system in which two individual beam emitters share a common partially-reflective mirror (such as an output coupler), there is the potential for feedback light from one emitter to enter the other emitter. This undesirable feedback (or "cross-talk" or "cross-coupling") from a "non-originated" emitter reduces the efficiency of the system. The approaches and embodiments described herein may apply to one- and two-dimensional beam combining systems along the slow-diverging dimension (or "direction"), fast-diverging dimension, or other beam combining dimensions. For purposes of this application, emitted beams have profiles in which one dimension is close to or fully diffraction limited, while the other dimension is many times diffraction limited. Another way of describing this may be in terms of axis and/or dimension. For example, an output beam may have a slow and a fast diverging axis or dimension.

When using the term substantially greater, when referring to the focal length of one optical element as compared to the focal length of another optical element (f1>>f2), it is to be understood that to be a factor of at least 2, 3, 4, 5, 7 times or greater. For example, the focal length of f1 may be 100 mm or more while the focal length of f2 is 50 mm or less. In another example, the focal length of f1 may be 200 mm or more while f2 is 20 mm or less. The term "angular filter" refers to a plurality of optical elements that create a specified numerical aperture for feedback beams. The size of this numerical aperture may limit the allowed feedback to only that corresponding to the originally emitted beam. That is, the angular filter prevents adjacent or nearby emitted beams from returning into the original emitter (i.e., cross-talk). Stabilization of emitters refers to feedback received by each emitter that has been narrowed to a distinct wavelength. This may be in the form of seeding the emitters with a particular wavelength, causing a portion of the emitted beam to be redirected back into the emitter, and intervening with the feedback, such as placing an optical grating in the way, to produce a distinct wavelength to be directed into the emitters as feedback. Often, feedback is reflected back towards the original emission area, where it passes through a dispersive element or diffraction grating prior to entering back into the optical gain medium portion of the original emitter. In some WBC embodiments, the feedback source may be a common reflective surface that provides feedback to multiple emitters, with each of the feedback beams being individually tuned to a particular wavelength.

Figure 1B:
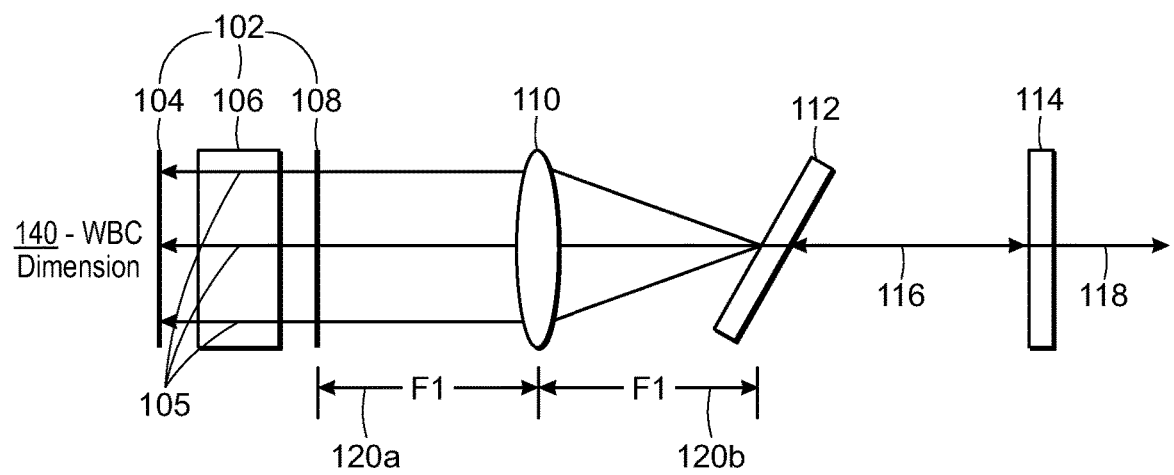
FIG. 1B is a schematic of a wavelength beam combining (WBC) method in the beam-combining dimension in accordance with embodiments of the invention.

FIGS. 1A-1B illustrate an external-cavity one-dimensional (1-D) WBC system including or consisting essentially of a one-dimensional beam emitter 102 (e.g., a diode bar) having a back reflective surface 104, a gain medium 106 with, e.g., two or more diode emitters 105, a front reflective surface 108, a combining optic 110, a dispersive element 112, and a partially reflecting output coupler 114. In this embodiment, the combining optic or lens 110 is placed a focal distance 120a away from the front reflective surface 108 of the diode bar 102 while on the back plane or other side of lens 110, dispersive element 112 is placed a focal distance 120b away. The output coupler 114 is placed at a certain distance from the dispersive element 112 and reflects a portion of the generated beams (feedback 116) back towards dispersive element 112.

In this embodiment, the placement of the combining lens 110 accomplishes two functions. The first function is to overlap all the chief rays from all the diode elements onto the dispersive element 112. The second function is to collimate each beam in both axes. FIGS. 1A and 1B illustrate a schematic view of the non-beam-combining dimension 130 view (FIG. 1A) and the beam-combining dimension 140 view (FIG. 1B). Emitter 102 includes or consists essentially of multiple emitters (e.g., diode emitters) 105, a back reflecting surface 104, gain medium 106, and a front surface/facet 108.

Figure 2:
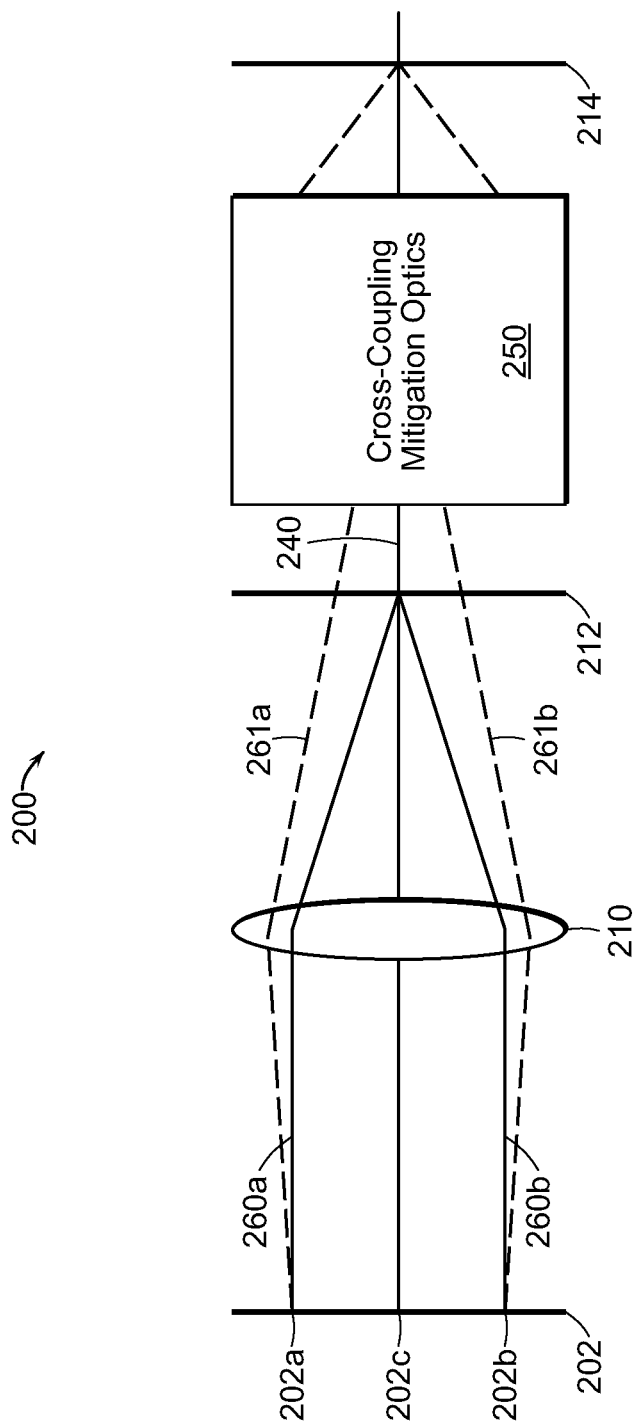
FIG. 2 is a schematic of a WBC laser system that incorporates an optical cross-coupling mitigation system in accordance with embodiments of the invention.

In WBC resonators it is possible for adjoining emitters to optically cross-couple with each other. This may seriously degrade the output beam quality. FIG. 2 is a schematic of a WBC resonator with two adjoining emitters 202a and 202b sending their nominal on-axis chief rays 260a and 260b (shown as solid lines) to lens 210, which focuses them onto the center of the dispersive element (e.g., diffraction grating) 212. From there, both chief rays are diffracted at their own unique wavelengths to propagate along the same axis 240, through the cross-coupling mitigation optics 250 that represents any and all lenses or optical elements between the grating 212 and the partially-reflective coupler 214. Both rays are then partially reflected back onto themselves, propagating backwards to self-couple into their respective emitters. The dashed lines 261a and 261b in FIG. 2 show the chief rays that would result in optical cross-coupling between the two emitters—i.e. a chief ray emanating from one emitter couples back into another emitter.

The following parameters are defined as follows:

d=distance between the two emitters (symmetrically displaced above and below the axis by +/−(d/2)).

ϵ=deviation angle (the angle between the solid-line chief rays and the dotted-line chief rays at the emitters.

$\theta_{1/2}$=semi-divergence far-field angle of an emitter in the WBC direction.

$L_0$=distance from the emitters to lens L1.

$f_1$=focal length of lens L1.

In FIG. 2, the grating is shown as if it worked at normal incidence. Here, it is assumed that the system is operating in the Littrow configuration, where the incident angle and the diffracted angle are equal (and non-zero). In the Littrow configuration, a small change in the incident angle is matched to first order by an equal change in the diffracted angle. In the unfolded schematic, then, any ray operating at Littrow would appear to propagate straight through the grating. It is clear that only the center ray 202c (the one that would emanate from an imaginary emitter halfway between two emitters 202a and 202b) self-couples at Littrow.

The symmetry in FIG. 2 is deliberate, as it allows for a couple of important simplifications in the analysis of the unique deviation angle E at which a chief ray could exit one emitter and return to the other. The first symmetry-based simplification is that the deviated (dashed-line) chief ray must hit the coupler at its center. The second simplification is that the cross-coupling wavelength must be the average of the two self-coupling wavelengths. This would in turn be the wavelength of an imaginary emitter halfway between the two emitters, which, as noted above, would self-couple at Littrow. Therefore, the dashed-line chief rays in FIG. 2 must traverse the grating at Littrow, meaning that they would appear to propagate straight through the grating as shown. Using this simplification, a conventional "y/y-bar" (chief ray height/chief ray slope) analysis may be utilized to trace the top dashed-line chief ray:

Leaving the top emitter:

$$y_{emitter} = \frac{d}{2} \quad (1)$$

$$\bar{y}_{emitter} = \varepsilon \quad (2)$$

Entering lens L1:

$$y_{L1\_in} = y_{emitter} + L_0 \bar{y}_{emitter} = \frac{d}{2} + L_0 \varepsilon \quad (3)$$

$$\bar{y}_{L1\_in} = \bar{y}_{emitter} = \varepsilon \quad (4)$$

Exiting lens L1:

$$y_{L1\_out} = y_{L1\_in} = \frac{d}{2} + L_0 \varepsilon \quad (5)$$

$$\bar{y}_{L1out} = \bar{y}_{L1in} - \frac{y_{L1in}}{f_1} = \varepsilon - \frac{\frac{d}{2} + L_0 \varepsilon}{f_1} = \varepsilon\left(\frac{f_1 - L_0}{f_1}\right) - \frac{d}{2f_1} \quad (6)$$

Entering and exiting the grating (recall from the discussion above that the dashed-line chief ray does not change direction at the grating):

$$y_{grating} = y_{L1\_out} + f_1 \bar{y}_{L1\_out} = \frac{d}{2} + L_0 \varepsilon + \varepsilon(f_1 - L_0) - \frac{d}{2} = \varepsilon f_1 \quad (7)$$

$$\bar{y}_{grating} = \bar{y}_{L1\_out} = \varepsilon\left(\frac{f_1 - L_0}{f_1}\right) - \frac{d}{2f_1} \quad (8)$$

To finish the calculations at the coupler, which involves propagating through the cross-coupling mitigation optics, recall that the dashed-line chief ray intersects the coupler at its center. Therefore, only the ray slope at the coupler is non-zero, and note that the ray height and ray slope at the grating must both be proportional to the ray slope at the coupler. This implies that the ratio of the height to the slope at the grating must be a constant. And, one may interpret that constant very intuitively as the negative of the effective distance of the coupler from the grating, as determined by the cross-coupling mitigation optics. In other words, $$\frac{y_{grating}}{\bar{y}_{grating}} \equiv -L_{cplr\_eff} \quad (9)$$

Where $L_{cplr\_eff}$ is the effective distance of the coupler beyond (to the right of) the grating.

In practice, $L_{cplr\_eff}$ can be calculated either with a raytrace or with a y/y-bar analysis of the post-grating lenses. But in any case, Equation 9 allows one to solve Equations 7 and 8 for the deviation angle E with the following result:

$$\varepsilon = \left(\frac{d}{2f_1}\right) \bigg/ \left[\left(\frac{f_1 - L_0}{f_1}\right) + \left(\frac{f_1}{L_{cplr\_eff}}\right)\right] \quad (10)$$

Now that the deviation angle E that results in cross-coupling has been determined, the amount of cross-coupling may be calculated. One reasonable definition of the cross-coupling is the integral over solid angle at the emitter of the product of the self-coupled intensity and the cross-coupled intensity, normalized by the integral of the square of the self-coupled intensity. Prior to calculating that integral, it is important to note that in the name of simplifying symmetry, it is assumed that both the outgoing and incoming beams at the cross-coupling emitters equally deviate. Thus, for the overlap integral, consider one beam (the self-coupled beam) to be undeviated, and the other beam (the cross-coupled beam) to be deviated by twice the angle E. Putting this paragraph into equation form provides:

$$\text{overlap} = \frac{\int \exp\left[-2\left(\frac{\theta}{\theta_{1/2}}\right)^2\right]\exp\left[-2\left(\frac{\theta-2\varepsilon}{\theta_{1/2}}\right)^2\right]d\theta}{\int \exp\left[-2\left(\frac{\theta}{\theta_{1/2}}\right)^2\right]\exp\left[-2\left(\frac{\theta}{\theta_{1/2}}\right)^2\right]d\theta} \quad (11)$$

(Note that Equation 11 involves one-dimensional integrals over a single angle instead of two-dimensional integrals over solid angles. This is because the integration over angle in the direction orthogonal to the beam deviation yields a constant that drops out of the ratio in Equation 11.) Equation 11 can be simplified to yield:

$$\text{overlap} = \exp\left[-\left(\frac{2\varepsilon}{\theta_{1/2}}\right)^2\right] \quad (12)$$

In summary, one may calculate the relevant deviation angle E in terms of known parameters according to Equation 10. The resulting overlap may then be calculated according to Equation 12. This gives the ratio of cross-coupled intensity to self-coupled intensity, assuming that in the self-coupled case there is a perfect waist at the coupler.

There is a very interesting possibility for having a large impact on cross-coupling when near but not quite at the usual configuration of placing the emitters one focal length back from L1. If we precisely placed the emitters there, then the first term in the denominator of Equation 10 would be zero, and Equation 10 would reduce to:

$$\varepsilon_{(L_0 = f_1)} = \frac{(d)(L_{cplr\_eff})}{2f_1^2} \quad (13)$$

Substituting Equation 13 into Equation 12 yields:

$$\text{overlap} = \exp\left[-4\left(\frac{d*(L_{cplr\_eff})}{d'*Zr}\right)^2\right].$$

Here d' is the emitter diameter at the near field, and Zr is the Rayleigh range of the beam. Thus, to reduce cross coupling the near-field fill-factor (d/d') should be high, the optical path length between the grating and coupler should be long, and the Rayleigh range should be short. Typically the near-field fill-factor is fixed. As an example, if it is assumed that the WBC system includes 20 diode bars and a transform lens having a focal length of 2000 mm, then the beam size at the grating is roughly 40 mm (assuming 20 milli-radian full beam divergence). The Rayleigh range of such a beam (1 μm wavelength and diffraction limited) is about 160 m. The distance between the grating and output coupler should be comparable to the Rayleigh range for cross coupling mitigation. Such length would make the WBC system essentially impractical. However, if the beam is de-magnified by 40× between the grating and the output coupler the optical path length is shortened by 160× or to about 1 m. Further reduction in optical path length may be achieved using larger reduction in beam size. The beam de-magnification may be accomplished using various mechanisms such as lenses, prisms, or a combination of both. Careful design must be considered such that self-coupling of each emitter does not degrade such that the cavity suffers in performance.

But, if the emitters are slightly off from this position, then the first term in the denominator of Equation 10 can actually cancel the second term, making the required deviation angle infinite and the cross-coupling overlap zero. Specifically, this happens when:

$$L_0 = f_1 + \left(\frac{f_1^2}{L_{cplr\_eff}}\right) \quad (14)$$

In other words, when the effective distance to the coupler $L_{cplr\_eff}$ is very large, Equation 14 gives us a potential recipe for pulling the emitters slightly back from the front focus of L1 in order to destroy cross-coupling.

Figure 3:
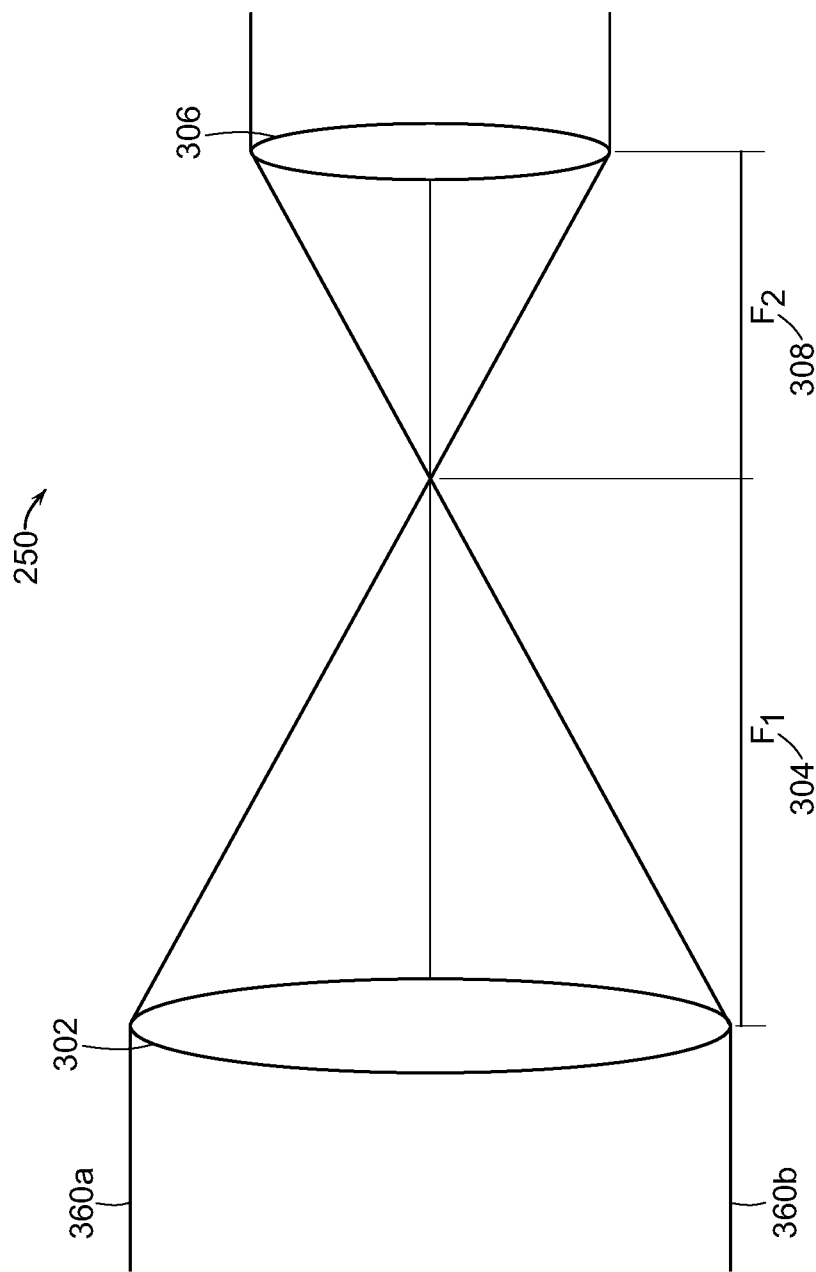
FIG. 3 is a schematic of an exemplary optical cross-coupling mitigation system for a WBC laser system in accordance with embodiments of the invention.

FIG. 3 illustrates one example of a cross-coupling mitigation system 250 illustrated by a box in FIG. 2. Here, optical element 302 may be a lens having a focal length $F_1$ 304. A second optical element 306 may also be a lens and have a focal length $F_2$ 308. The distance between 302 and 306 is exactly or approximately the sum of the focal lengths $F_1$ and $F_2$. As discussed previously, it is preferred that the ratio of $F_1$ over $F_2$ ($F_1/F_2$) is at least two times or greater. The system 250 may be an afocal telescoping system. In other embodiments, multiple optical elements may be used wherein the effect of the system still maintains the properties of an afocal telescoping system having a large ratio.

In various embodiments, it is desirable to place lens 302 within the Rayleigh range of beams being transmitted from a dispersive element (e.g., diffraction grating) while also placing a partially-reflective output coupler or other reflective surface within the Rayleigh range of beams coming out of lens 306. By appropriately placing lenses having a $F_1 \gg F_2$ relationship within these positions, an effective system is created to reduce and in some cases eliminate any cross-coupling feedback from entering the non-originating emitter or source.

Figure 4:
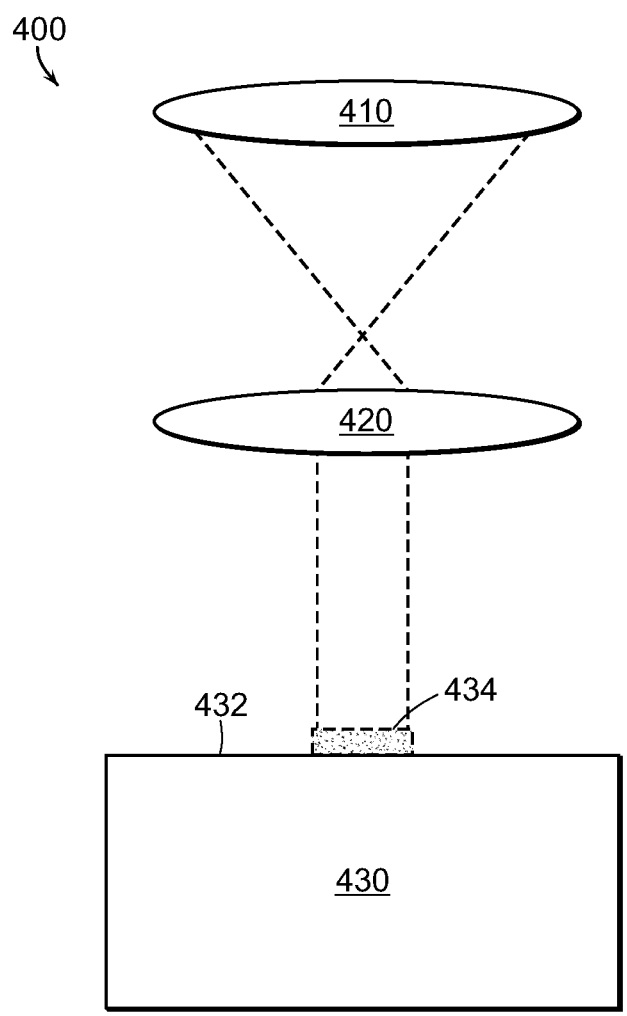
FIG. 4 is a schematic of an optical cross-coupling mitigation system and an output coupler for a WBC laser system in accordance with embodiments of the invention.

FIG. 4 illustrates a stabilization system 400 (that may be a portion of a WBC laser system) in accordance with an embodiment of the present invention in which an optical cross-coupling mitigation system (which may include or consist essentially of optical elements 410, 420) is utilized in conjunction with a partially reflective output coupler 430 engineered to minimize reflections that might result in unwanted feedback. As shown, the output coupler 430 includes a partially reflective beam-receiving portion 434 sized and positioned to receive the beam from optical element 420. Specifically, beam-receiving portion 434 typically has a diameter (or other lateral dimension) approximately the same size as the diameter (or other lateral dimension) of the beam it receives. The beam-receiving portion 434, which may be approximately centered on a surface of the output coupler 430, is surrounded by a non-reflective portion (or surface) 432 that has a reflectivity of 1% or less to the wavelengths of the received beam. For example, the non-reflective portion 432 may be coated with an anti-reflection coating to prevent undesired back-reflection that might result in optical cross-talk. Thus, any stray light propagating to the output coupler 430 outside of the beam-receiving portion 434 will not be reflected back to the beam emitters of the WBC system. The beam-receiving portion 434 may protrude from the remainder of the surface of coupler 430 (i.e., may be elevated with respect to non-reflective portion 432), as shown in FIG. 4, or the beam-receiving portion 434 may be approximately coplanar with non-reflective portion 432.

The beam-receiving portion 434 may have a reflectivity to the wavelengths of the beam of less than approximately 15%, e.g., in the range of approximately 2% to approximately 10%, so as to provide the desired wavelength stabilization of the beams from the associated emitters. It will be appreciated that the remainder of the received beam will pass through the output coupler 430 and be transmitted to downstream optical system components (e.g., an optical fiber or a workpiece).

Figure 5:
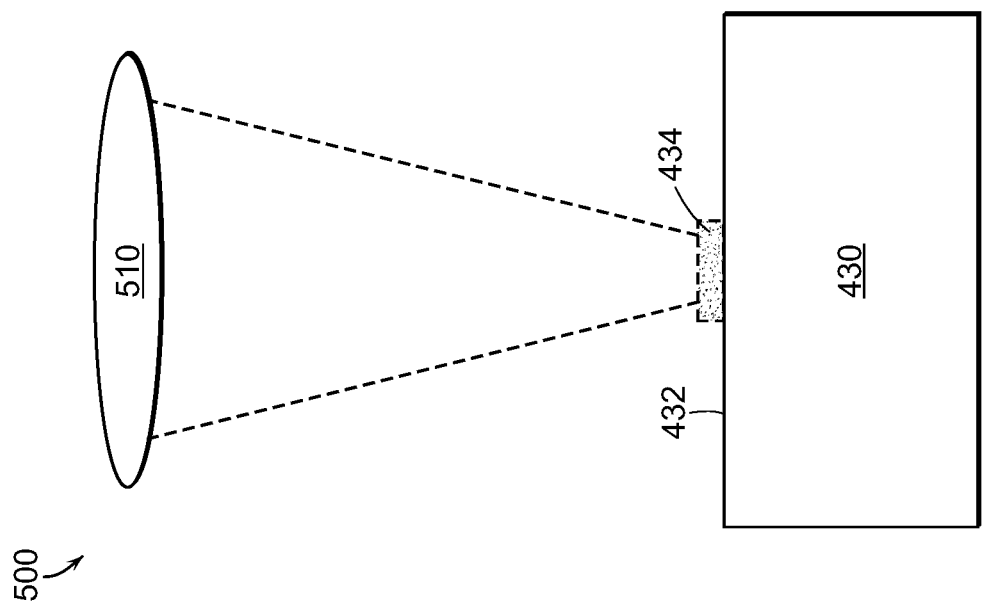
FIG. 5 is a schematic of an optical element and an output coupler for a WBC laser system in accordance with embodiments of the invention.

FIG. 5 illustrates a stabilization system 500 (which may be a portion of a WBC laser system) in accordance with an embodiment of the present invention in which an optical element 510 (e.g., a cylindrical or spherical lens) simply focuses the beam onto the partially reflective output coupler 430, and no second collimating optical element is present therebetween. In this manner, the output coupler 430 may be utilized in a WBC laser system without the use of an optical cross-coupling mitigation system (e.g., one including or consisting essentially of two or more optical elements such as lenses).

Figure 6:
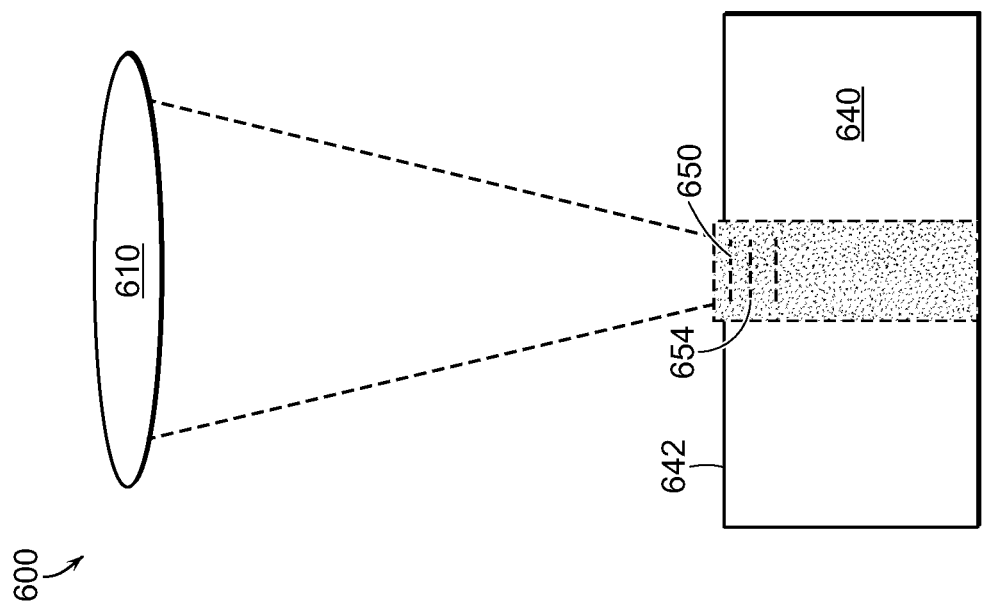
FIGS. 6-8 are schematics of portions of optical fibers utilized as output couplers for WBC laser systems in accordance with embodiments of the invention.

FIG. 6 illustrates a portion of a WBC laser system 600 in which an optical element 610 focuses light directly into the core 650 of an optical fiber that includes one or more features operating as the partially reflective output coupler. As shown, the optical fiber may also have a cladding 640 surrounding the core 650; typically, the cladding 640 has a refractive index less than that of the core 650 such that light within the core 650 is confined. The end surface of the core 650 may be substantially coplanar with the end surface 642 of the cladding, or the core 650 may protrude slightly from surface 642. In order to provide the wavelength stabilization, the end surface of the core 650 may be partially reflective to the wavelengths of the beam (e.g., between approximately 2% and approximately 10% reflective, or between approximately 4% and approximately 10% reflective). In various embodiments, the partial reflectivity may be provided by a coating on the end surface of the core.

In various embodiments of the invention, instead of or in addition to a partially reflective coating, a fiber Bragg grating 654 may be provided within the core 650 to provide the desired partial reflectivity. As known to those of skill in the art, the fiber Bragg grating includes or consists essentially of a periodic variation of the refractive index of a portion of the fiber (e.g., within the core 650). The period variation may be, e.g., on the order of one-half of the wavelength (or one of the wavelengths) of the received beam, and the grating thus induces Fresnel reflection. The wavelength dependence and/or the magnitude of the reflection may be selected by the particular grating pattern and the refractive-index variation therein. In various embodiments, multiple fiber Bragg gratings 654 may be disposed within the core 650, and each grating 654 may have a different refractive-index variation and/or wavelength selectivity.

In various embodiments, the surface 642 of the cladding 640 may be coated with an anti-reflective coating so as to prevent any deviating light which strays from the beam from reflecting back into adjacent emitters or beams. For example, the surface 642 may be coated so as to have a reflectivity of less than 1% for the wavelengths of the beam.

Figure 7:
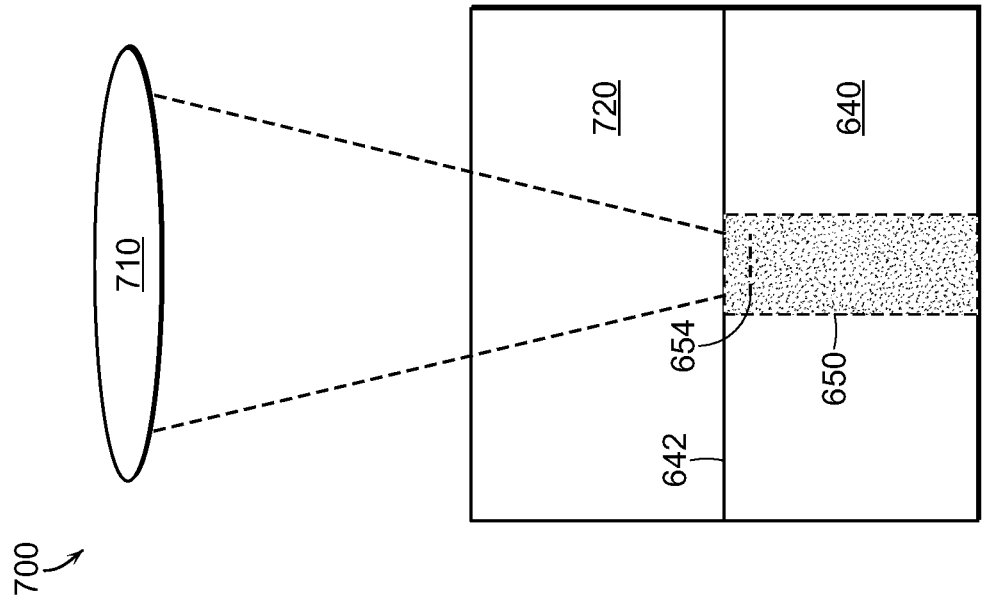

FIG. 7 illustrates a wavelength stabilization system 700 (which may be a portion of a WBC laser system) in which an optical element 710 focuses light into the core 650 of the optical fiber. In system 700, an end cap 720 is disposed over and in contact with core 650 (and, in some embodiments, surface 642 of the cladding 640); in some embodiments, the end cap 720 is attached to the optical fiber with an index-matching material therebetween. In other embodiments, at least a portion of the optical fiber (e.g., core 650) is directly fused to the end cap 720. As shown in FIG. 7, the presence of the end cap 720 enables the effective interface between the optical fiber and the oncoming beam (i.e., the point at which the beam enters the end cap) to receive the beam when it has a greater diameter (or width), thereby reducing the power density of the beam upon entry to the optical fiber. The presence of the end cap 720 may also protect other portions of the optical fiber from heat, moisture, and/or other environmental contaminants.

Figure 8:
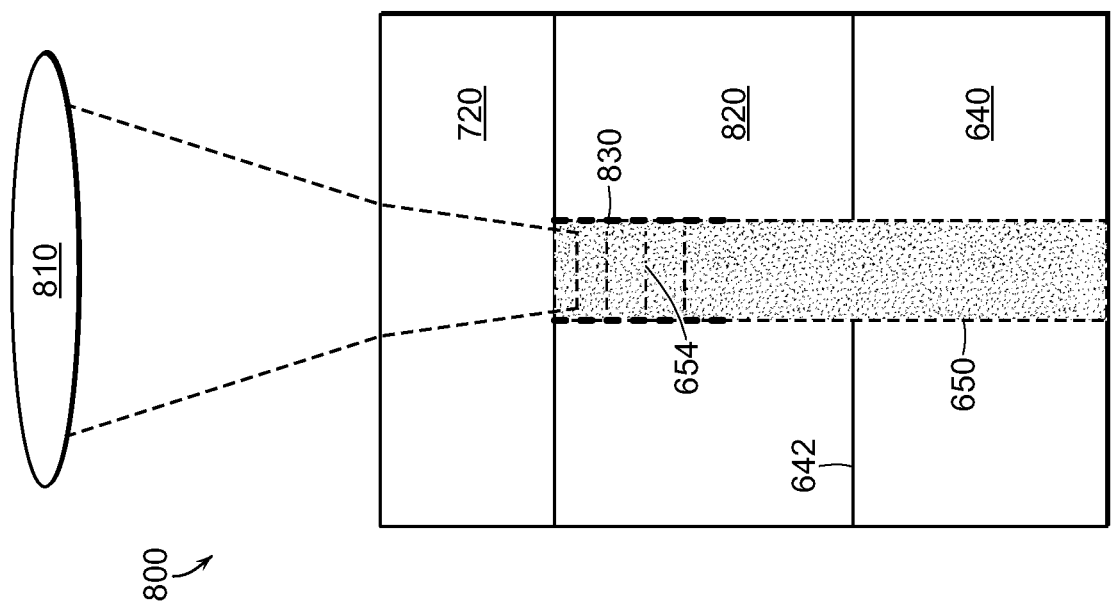

FIG. 8 illustrates a wavelength stabilization system 800 (which may be a portion of a WBC laser system) in which an optical element 810 focuses light into the core 650 of the optical fiber. System 800 incorporates a mode stripper 820 in order to further increase the purity and transmission capabilities of the optical fiber with respect to the beam. It will be appreciated that as beams change transmission media the various refraction indices and light entrance angles into an optical fiber may result in a cladding mode, i.e. light traveling within the material of the cladding. This cladding mode may be undesirable, as such light may result in wavelength distortion and contamination of the primary beam. As known to those of skill in the art, the mode stripper 820 may include, consist essentially of, or consist of a material having a refractive index no less than (i.e., equal to or greater than) that of the cladding 640; in this manner, light that might typically propagate as a cladding mode within the cladding will preferentially enter the mode stripper and radiate out of the optical fiber. In various embodiments, the mode stripper 820 will have a refractive index larger than that of the cladding 640. As shown in FIG. 8, an index-matching material 830 may be disposed between the core 650 (or, in some embodiments, the cladding 640) and the mode stripper 820. (As used herein, the term "index-matching material" refers to a material disposed between two other materials and having a refractive index between the refractive indices of the two materials or approximately equal to the refractive index of one or both of the materials.) Although FIG. 8 depicts the mode stripper 820 as directly surrounding the core 650, in various embodiments at least a portion of the cladding 640 is disposed between the core 650 and the mode stripper 820.

In any of the aforementioned wavelength stabilization systems it will be appreciated that the beam may be manipulated in various ways via the addition of optical and/or dispersive elements configured to achieve the desired beam qualities. For example, optical elements such as gratings and/or collimators may be present in the WBC system and/or the stabilization system. It will also be appreciated that the partially reflective elements may be provided with partially reflective properties by any number of means, including but not limited to providing gratings, coatings, etc. so as to achieve the desired transmission and desired reflection qualities.

The terms and expressions employed herein are used as terms of description and not of limitation, and there is no intention, in the use of such terms and expressions, of excluding any equivalents of the features shown and described or portions thereof, but it is recognized that various modifications are possible within the scope of the invention claimed.

What is claimed is:

1. A laser system comprising:
   an array of beam emitters each emitting a beam having a different wavelength;
   focusing optics for focusing the beams toward a dispersive element;

a dispersive element for receiving and dispersing the focused beams, thereby forming a multi-wavelength beam; and an output coupler comprising (i) a beam-receiving portion for receiving the multi-wavelength beam, reflecting a first portion thereof back to the array of beam emitters via the dispersive element, and transmitting a second portion thereof as an output beam composed of multiple wavelengths, and (ii) a non-reflective portion.

2. The laser system of claim 1, wherein the beam-receiving portion of the output coupler is at least as large as a diameter of the multi-wavelength beam.

3. The laser system of claim 1, wherein the beam-receiving portion of the output coupler protrudes above the non-reflective portion.

4. The laser system of claim 1, wherein the non-reflective portion at least partially surrounds the beam-receiving portion.

5. The laser system of claim 1, wherein a reflectivity to the multi-wavelength beam of the non-reflective portion is less than 1%.

6. The laser system of claim 1, wherein a reflectivity to the multi-wavelength beam of the beam-receiving portion is less than approximately 15%.

7. The laser system of claim 1, wherein a reflectivity to the multi-wavelength beam of the beam-receiving portion ranges from approximately 2% to approximately 10%.

8. The laser system of claim 1, further comprising a non-reflective coating disposed over the non-reflective portion of the output coupler.

9. The laser system of claim 1, further comprising an end cap over the beam-receiving portion of the output coupler.

10. The laser system of claim 1, further comprising an optical fiber positioned to receive the output beam.

11. The laser system of claim 1, further comprising a workpiece positioned to receive the output beam.

12. The laser system of claim 1, further comprising an optical element for focusing the multi-wavelength beam toward the output coupler.

13. The laser system of claim 12, wherein the optical element comprises at least one of a cylindrical lens or a spherical lens.

14. The laser system of claim 1, further comprising a cross-coupling mitigation system for receiving and transmitting the multi-wavelength beam while reducing cross-coupling thereof.

15. The laser system of claim 14, wherein the beam-receiving portion of the output coupler is disposed within a Rayleigh range of the multi-wavelength beam transmitted by the cross-coupling mitigation system.

16. The laser system of claim 14, wherein at least a portion of the cross-coupling mitigation system is disposed within a Rayleigh range of the multi-wavelength beam transmitted by the dispersive element.

17. The laser system of claim 14, wherein the cross-coupling mitigation system comprises an afocal telescope.

18. The laser system of claim 14, wherein the cross-coupling mitigation system comprises a first optical element having a first focal length and a second optical element having a second focal length, the first optical element being disposed optically upstream of the second optical element.

19. The laser system of claim 18, wherein the first focal length is at least two times greater than the second focal length.

20. The laser system of claim 18, wherein the first focal length is at least seven times greater than the second focal length.

21. The laser system of claim 18, wherein each of the first and second optical elements comprises a lens.

22. The laser system of claim 18, wherein the first optical element is disposed within a Rayleigh range of the multi-wavelength beam transmitted by the dispersive element.

23. The laser system of claim 18, wherein the beam-receiving portion of the output coupler is disposed within a Rayleigh range of the multi-wavelength beam transmitted by the second optical element.

24. The laser system of claim 18, wherein an optical distance between the first and second optical elements is approximately equal to a sum of the first and second focal lengths.

* * * * *